United States Patent
Delacruz et al.

(10) Patent No.: US 10,910,344 B2
(45) Date of Patent: Feb. 2, 2021

(54) SYSTEMS AND METHODS FOR RELEVELED BUMP PLANES FOR CHIPLETS

(71) Applicant: Xcelsis Corporation, San Jose, CA (US)

(72) Inventors: Javier A. Delacruz, San Jose, CA (US); Belgacem Haba, Saratoga, CA (US); Cyprian Emeka Uzoh, San Jose, CA (US); Rajesh Katkar, Milpitas, CA (US); Ilyas Mohammed, Santa Clara, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

(21) Appl. No.: 16/016,485

(22) Filed: Jun. 22, 2018

(65) Prior Publication Data
US 2019/0393190 A1 Dec. 26, 2019

(51) Int. Cl.
*H01L 25/065* (2006.01)
*H01L 23/00* (2006.01)

(52) U.S. Cl.
CPC .......... *H01L 25/0652* (2013.01); *H01L 24/08* (2013.01); *H01L 24/11* (2013.01); *H01L 2224/08146* (2013.01); *H01L 2224/119* (2013.01); *H01L 2224/11464* (2013.01); *H01L 2224/13005* (2013.01); *H01L 2225/06517* (2013.01); *H01L 2225/06544* (2013.01); *H01L 2225/06555* (2013.01)

(58) Field of Classification Search
CPC .......................... H01L 24/08; H01L 27/3255
See application file for complete search history.

(56) References Cited

U.S. PATENT DOCUMENTS

| | | | |
|---|---|---|---|
| 6,962,835 B2 | 11/2005 | Tong et al. | |
| 9,224,697 B1 * | 12/2015 | Kwon | ..................... H01L 23/562 |
| 9,312,198 B2 * | 4/2016 | Meyer | ..................... H01L 23/31 |
| 2012/0119360 A1 * | 5/2012 | Kim | ..................... H01L 21/565 |
| | | | 257/737 |
| 2013/0009325 A1 * | 1/2013 | Mori | ..................... H01L 23/5389 |
| | | | 257/774 |
| 2015/0235991 A1 * | 8/2015 | Gu | ..................... H01L 25/0655 |
| | | | 257/762 |

* cited by examiner

*Primary Examiner* — Stephen M Bradley
(74) *Attorney, Agent, or Firm* — Lerner, David, Littenberg, Krumholz & Mentlik, LLP (57) ABSTRACT

An integrated circuit and a method for designing an IC wherein the base or host chip is bonded to smaller chiplets via DBI technology. The bonding of chip to chiplet creates an uneven or multi-level surface of the overall chip requiring a releveling for future bonding. The uneven surface is built up with plating of bumps and subsequently releveled with various methods including planarization.

5 Claims, 9 Drawing Sheets

SYSTEMS AND METHODS FOR RELEVELED BUMP PLANES FOR CHIPLETS

FIELD OF THE INVENTION

The following description relates to the design of microelectronic structures. More specifically it relates to the reconfiguration of the bump plane on chiplets when bonding multiple die.

BACKGROUND

Microelectronics typically involve the use of thin semiconductor materials such as silicon wafers that may be formed into individual units or dies. Such elements are often used in integrated circuits (ICs) that may be subsequently installed onto printed circuit boards (PCBs). The field of Microelectronics has rapidly expanded over the last few decades with a demand for greater storage or memory capacity and decreased size. Additionally, cost reduction is a continual concern that greatly influences the development of new microelectronic technologies and procedures. These demands on the industry have led to the increased complexity of the design of the ICs and other microscale structures.

The demand for consumer products and applications for higher performance, higher capacity and lower cost has driven the demand for smaller more capable microelectronic components. Such increased demand for smaller sizes has led to the development of 3D stacking. 3D-Stacking typically involves the stacking of microelectronic components in a vertical fashion and applying vertical interconnections between the layers. Traditionally vertical interconnection methods have included through-silicon vias (TSVs), wire bonding, and flip chip methods that have enabled manufactures to produce ICs that have greater capacity and a smaller footprint.

The ever-increasing demand for smaller, faster, better components has led to the development of new methods of manufacture like the 3-D stacking that also present other issues as the overall design of the IC becomes more and more complex. The increased complexity of design also included the increased use of more advanced nodes and blocks that are incorporated into the overall IC design. These advanced nodes also pose potential issues in the overall function and structure of the IC because of their complexity and size thus driving a need to improve on how advanced portions of an IC are incorporated into the overall design and function of the microscale structure.

SUMMARY OF THE INVENTION

Systems and methods in accordance with many embodiments provide a stackable chip having a plurality of smaller chiplets bonded on the chip through a variety of interconnections. The interconnections extend from the surface of the chip through the smaller chiplets by way of through silicon vias. The bonded chiplets create an uneven surface from which to bond additional components or chips and subsequently the uneven surface of the chip with bonded chiplets is releveled through a variety of techniques creating a level surface from which to bond subsequent components.

Numerous embodiments include A method for producing a chip configured to be stacked. A chip configured to be stacked is used such that it has a front surface and a back surface and a plurality of side surfaces. A plurality of chiplets having a plurality of through silicon vias for interconnections between the chip and an external surface of the chiplet are configured to be bonded to the chip. The chiplets each also have a front chiplet surface and a back chiplet surface and a plurality of side chiplet surfaces. The chiplets may then be bonded to the chip such that a new outer surface is formed having more than one level. The uneven surface may then be prepared for releveling by patterning and exposing a first photo resist layer over the bonded chip and chiplets such that a plurality of openings are created in the photo resist layer exposing the through silicon via interconnects and a plurality of interconnects on the chip surface. The patterning may be followed by plating a plurality of posts such that the posts are disposed in the openings. The post may then be releveled such that the surface of the chip bonded with chiplets is reconfigured to be a single level.

In other embodiments, the method further comprises applying a passivation to the surface of the chip and chiplets; and removing the passivation from all the covered surfaces except the plurality of side chiplet surfaces thereby protecting the side surfaces from exposure to further metallic processing.

In still other embodiments the method further comprises applying a seed layer after the patterning and exposing of the photo resist layer.

In yet other embodiments, the seed layer is removed after the application of the solder cap to the plurality of bumps.

In still yet other embodiments, the photo resist layer is removed after the application of the solder cap.

In even other embodiments, a second photo resist layer is patterned and exposed.

In other embodiments, the first photo resist layer is removed prior to the application of the solder cap and wherein the second photo resist layer is removed after the application of the solder cap.

In still other embodiments, the method further comprises applying a mold layer over the surfaces of the chip and chiplets prior the releveling of the plurality of bumps.

In yet other embodiments, the mold layer is selected from a group consisting of compression molding, vacuum molding, and transfer molding.

In still yet other embodiments, the mold layer is selected from a group consisting of epoxy and silicone.

In even other embodiments the method further comprises the application of an additional layer selected from a group consisting of redistribution and repassivation.

In other embodiments, the method further comprises applying a permanent layer over the chip and plurality of chiplets after the chiplets have been bonded to the chip.

In still other embodiments, the first photo resist layer is patterned and exposed in such a manner that the exposed openings on the chip level are larger than the openings on the chiplet level, such that as the plating of the posts in the plurality of openings results in larger posts on the chip level than on the chiplet level such that the plating results in a single level that may not require additional releveling.

In yet other embodiments, the chiplets are configured in a manner comprising elements selected from a group consisting of SerDes, Memory, and parallel interface chips.

In still yet other embodiments, the method further comprises applying a solder cap to the plurality of bumps.

Numerous other embodiments include an individual stackable chip that has a front surface and a back surface and a plurality of side surfaces wherein the front surface comprises a plurality of interconnects. A plurality of chiplets having a plurality of through silicon vias for interconnections between the chip and an external surface of the chiplet and having a front chiplet surface and a back chiplet surface and a plurality of side chiplet surfaces are bonded to the chip. A plurality of plated posts are disposed on the front surface of chip and the front surface of the plurality of chiplets wherein the posts are configured to connect to the plurality of through silicon vias of the chiplets and the interconnects of the chips and wherein the plurality of plated posts have been relevelled creating a single level across the upper portion of the stackable chip. A solder cap disposed on the plurality of plated posts.

In other embodiments the chiplets are configured in a manner comprising elements selected from a group consisting of SerDes, Memory, and parallel interface chips.

In still other embodiments, the individual stackable chip further comprises a permanent layer disposed over the top surface of the chip and the top surface of the plurality of bonded chiplets.

In yet other embodiments, the individual stackable chip further comprises a mold layer disposed over the top surface of the chip and the top surface of the plurality of bonded chiplets.

In still yet other embodiments, the mold layer is selected from a group consisting of epoxy and silicone.

In even other embodiments, the stackable chip further comprises an additional layer disposed between the plurality of posts and the solder cap wherein the additional layer is selected from a group consisting of redistribution and repassivation.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with reference to the following figures, which are presented as various embodiments of the disclosure and should not be construed as a complete recitation of the scope of the disclosure, wherein.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

The configuration of various levels of a stacked integrated circuit including methods for producing such are described herein. In accordance with many embodiments chiplets are bonded to a chip with DBI technology having fine pitch interconnects and TSVs wherein a bump plane is created and releveled creating a single level bump plane for additional boding of layers.

Figure 1:
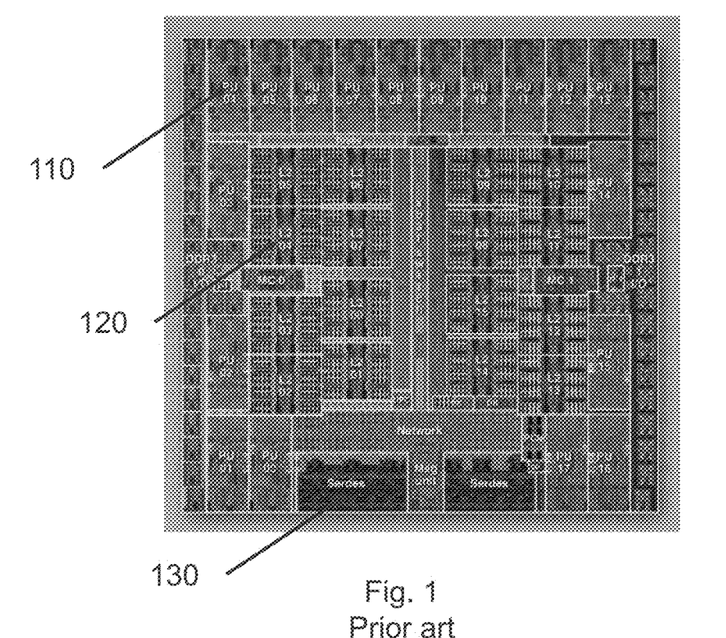
FIG. 1 illustrates an image of an IC design according to the present art.

Integrated circuit design generally deals with the creation of electrical components and the design and placement of such components onto a platform such as a silicon wafer. The design and layout of the electrical components is performed in such a way as to create functional blocks designed to perform certain processes of the integrated circuit. For example, some blocks may be a complex layout comprising a core of a processor; others may serve as controllers such as memory or graphics controllers, while others may be advanced SerDes Blocks. In other examples, the blocks can be as simple as amplifiers or gain blocks that may serve as attenuators or amplifiers. In some instances, the blocks may also comprise various types of passive elements such as resistors, capacitors and/or inductors that form the basis of an analog circuit. The analog circuit may be one type of circuit used in the design process wherein the layout of the various elements may be in series or parallel according to the overall function and physical constraints of the system. Moreover, such elements may use a heterogeneous processes which combines different foundry nodes and/or technologies such as Silicon Germanium (SiGe), Gallium Arsenide (GaAs), etc. The blocks may be considered the building blocks of an integrated circuit and each one is a carefully mapped out plan of transistors, resistors, capacitors and metallic interconnects forming the functional blocks of the IC design. FIG. 1 illustrates an example of an IC with various "blocks" depicted. For example, FIG. 1 illustrates an IC with various processing units (PU) 110 as well as L2 Cache blocks 120, and some SerDes blocks 130. These are a few examples of how blocks fit into the overall system design.

The demand for smaller, higher performing, and higher capacity components affects the design of the overall IC. IC design is mapped out in functional blocks. The functional blocks often include but are not limited to cores, memory controllers, processor controllers, parallel interface chips, and in some cases SerDes blocks. SerDes block is a configured portion of an IC in which a large number of parallel paths on the input end and converts them to a smaller number of high speed communication paths on the output end. SerDes blocks can take up large portions of a silicon substrate and require the placement on an advanced portion of the IC node. This is also true for other complex blocks in the IC. Furthermore, as the size of the IC decreases the IP design of the SerDes block and other advanced blocks can be affected such that the blocks become highly sensitive to rotational placement. In other words, as the size of the IC decreases and room becomes limited an advanced block cannot just be rotated to fit the space because the IP design on one side will not be equivalent to that on the other side.

The rotational sensitivity increases the number of designs required per IC, which can increase costs if designers have to maintain multiple designs for various rotational positions.

The bonding of layers of an IC has become an important aspect of the industry as the complexity of design increases and manufactures are looking for ways to improve efficiency of the product. An approach to bond layers of an IC is taught in U.S. Pat. No. 6,962,835 to Tong et al., which is incorporated herein by reference in its entirety. As taught by Tong a method of bonding layers known as Direct Bond Interconnect (DBI®) allows for layers to be bonded with an extremely fine pitch. Pitch refers to the ratio of thickness and distance between interconnects.

DBI technology is enhancing the ability to improve the design of integrated circuits through the use of chiplets. As technology developed with regards to integrated circuit design, blocks may have been contained in individualized chiplets or die that were fit into a larger system called multi-chip modules or System in Package (SIP). As the technology improved the individual chiplets were replaced with system on chip (SOC) design as analog and digital content (mixed signal) could be integrated into a single chip. With further improvements, including DBI technology, interconnects now have the capability of equaling the density of the SOC connections.

Figure 11:
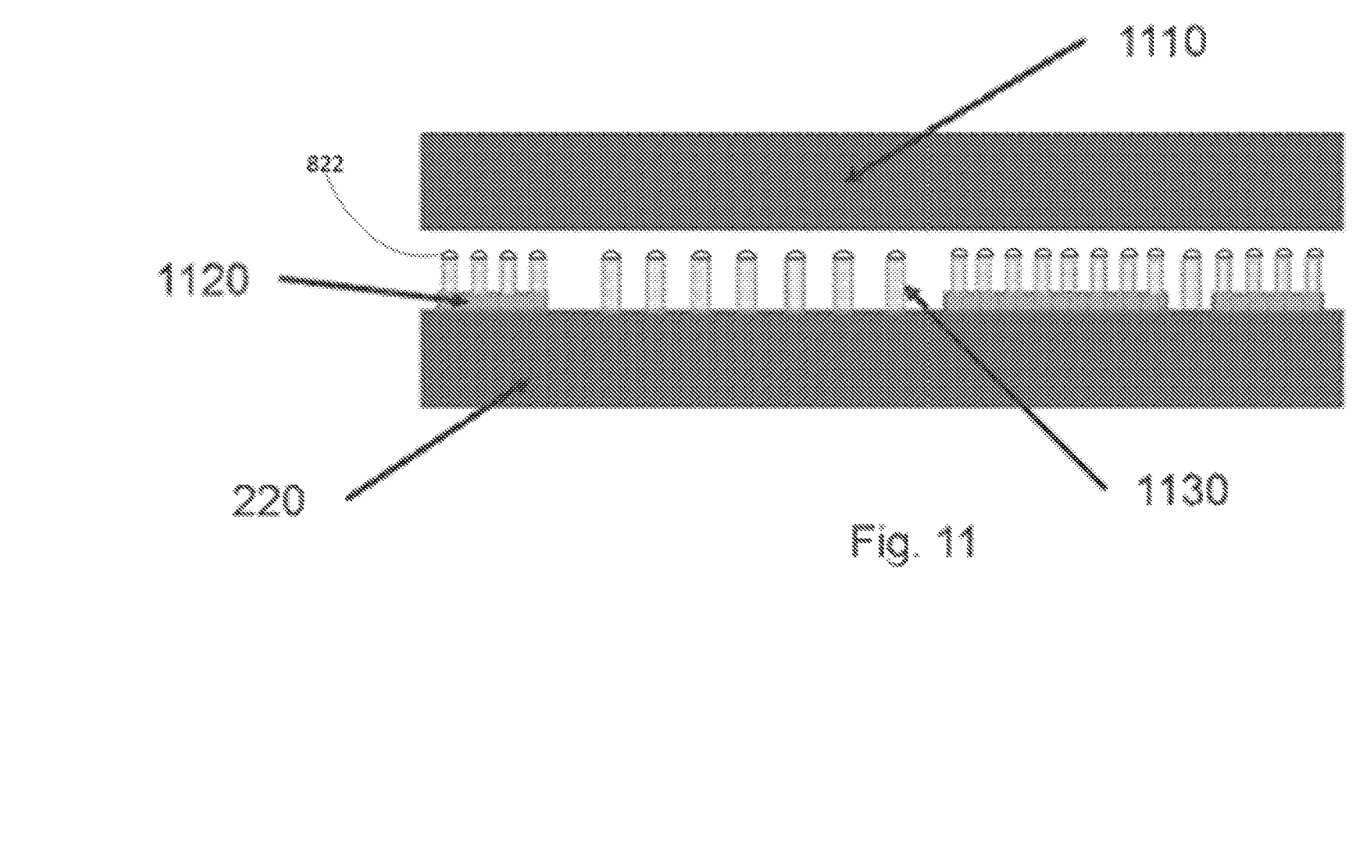
FIG. 11 illustrates an exemplary embodiment the bonding of chips in accordance with some embodiments.

The use of chiplets allows for advanced blocks such as SerDes to be removed from the main body of the IC chip and still serve as a functional block of the overall IC. This is an improvement over past chip designs because it increases the available space on the chip for other functional blocks while still maintaining the advanced blocks necessary for the ever-increasing demand. However, the DBI technology with the use of chiplets generates an issue with respect to the bump planes that are used in chip to chip bonding. Bump planes extend the interconnects to the next level assembly, such as another chip, interposer, substrate, etc., as illustrated in FIG. 11; thus, providing that the overall chip function is maintained between stacked layers. Bump planes are typically metallic buildups from the chip surface to a level height and will become a preferable method for creating a new bonding surface with the increased use of chiplets in IC design.

Figure 2A:
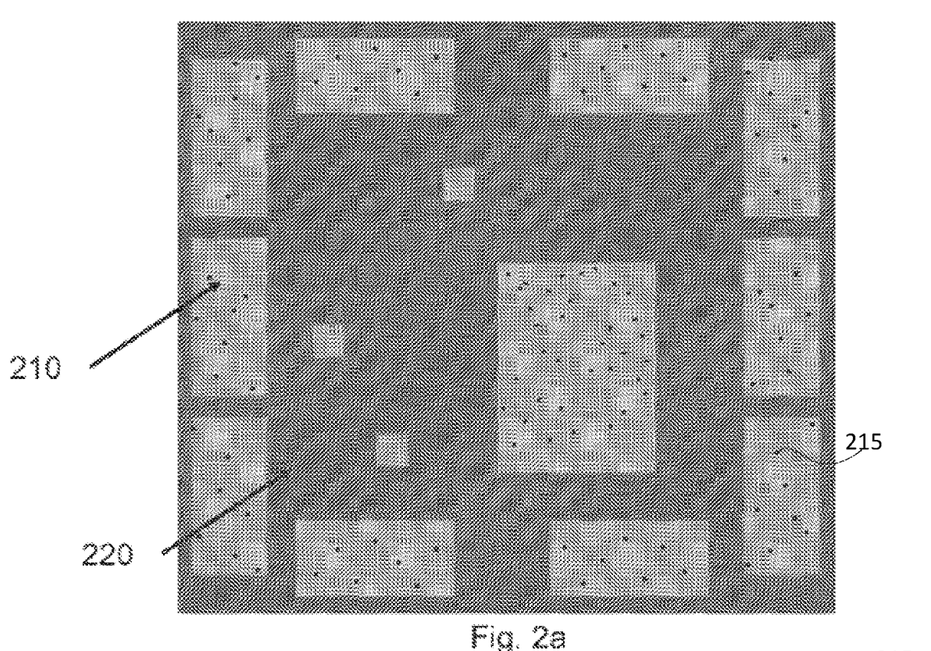
FIG. 2a illustrates a top view of an IC chip according to various embodiments.

Turning now to FIG. 2a, in many embodiments a chip or substrate 220 is bonded with a plurality of chiplets 210 using DBI technology. It can be seen from the side view in FIG. 2b the use of chiplets according to many embodiments creates an uneven or multi-level surface from which to bond the next layer or chip of the IC. In accordance with many embodiments, the bonding surface should be as level as possible given the constraints of the technology to properly form a bond with the next layer. The bonded chiplets may be configured with through silicon vias (TSVs) 215 that create interconnects between the outer surface of the chiplet and the underlying chip. The TSVs 215 will be the interconnect points from which bumps or posts are built upon as will be further described herein. It should be noted that when making reverence to plating the bumps/posts on the chiplet level it is done so in coordination with the TSVs 215 of the chiplets.

In accordance with many embodiments, FIGS. 3-5 and 7 illustrate process flows of methods of releveling the bump plane such that it is at one level rather than multiple levels after the bonding of chiplets to the chip.

It is preferable according to many embodiments to bond the chiplets using the DBI technology referenced herein. In accordance with many embodiments, the process of releveling the bump plane begins with the creating of a multi-level surface through the bonding of chiplets to a chip. This is done as illustrated by the process flows in FIGS. 3-5 and 7 as the beginning two steps of the processes according to many embodiments. The chips and the chiplets may be processed to prepare the chips and chiplets to be bonded via DBI technology. DBI bonding technique requires the flattening of the bonding surface to the extent that it is as flat as possible. In many cases the flattening actually creates a concave like surface that aids in the bonding. The bond is then formed between an oxide and metallic, usually copper, layer at room temperature or low temperature settings. The bond generally comprises a combination of covalent bonds and Van der Waals bonds. In many embodiments the bond is then low temperature annealed thereby creating a strong fine pitch interconnect between the two layers. The preparation and DBI bonding of the chips to chiplets is represented in steps 310 and 315 respectively in FIGS. 3-5 and 7 according to many embodiments.

Figure 2B:
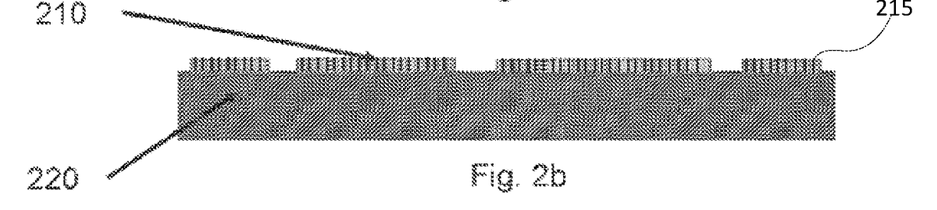
FIG. 2b illustrates a side view of an IC chip according to various embodiments.
Figure 3:
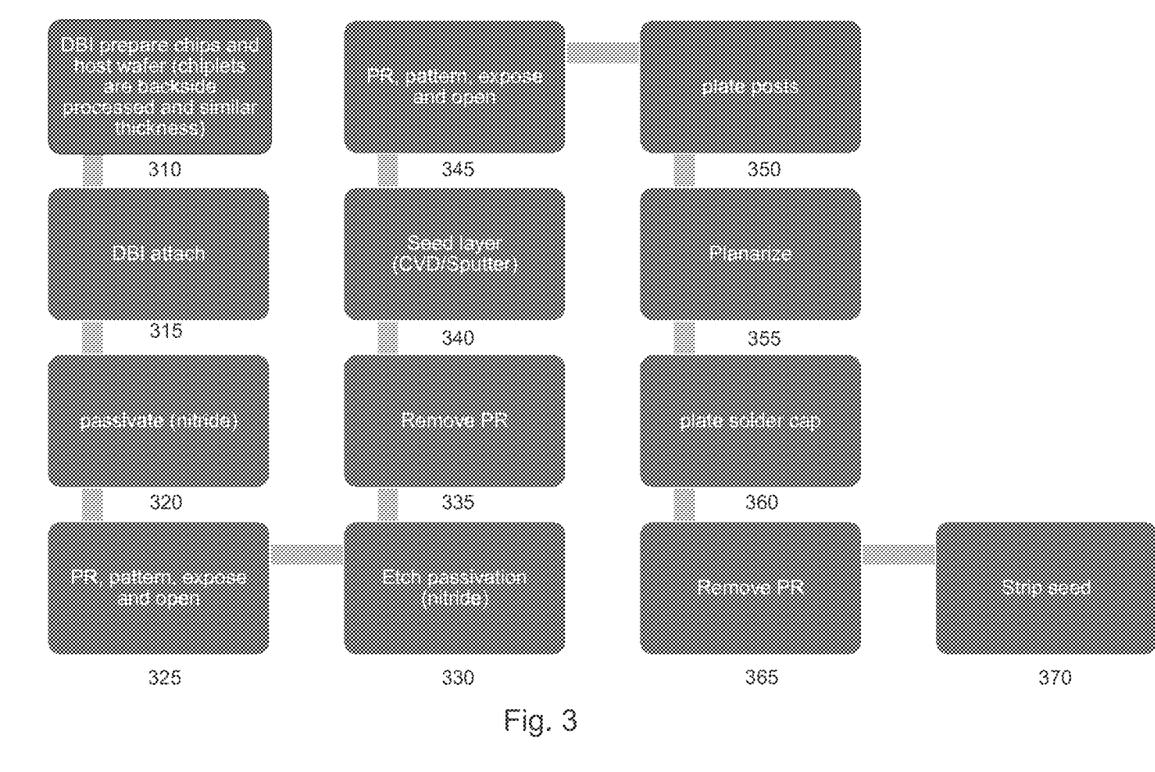
FIG. 3 illustrates a flow chart of a method for releveling bump planes in accordance with embodiments.

Now turning the focus to the flow diagram in FIG. 3, as the chiplets and chips are bonded, preferably thought DBI technology, an uneven surface is created as illustrated in FIG. 2b. The uneven surface now requires an even surface for subsequent bonding of chips in the process of 3-D stacking. The chip/chiplet combination surface may be passivated 320 with an inert solution that might render any metallic surfaces inert during the next few steps of the process. In many embodiments, the passivation 320 may be done with a nitride. While nitride is presented in step 320 any number of passivation substances may be used for this purpose.

Once passivation is complete, many embodiments may preferably apply a photo resist (PR) layer 325 wherein the PR layer is patterned, exposed such that openings are created exposing the lower chip surface. The application of a PR layer 810 is pictorially illustrated in FIG. 8 by element 810. In accordance with many embodiments the passivation is then etched 330 followed by the removal of the PR layer 335.

Prior to building the bump plane or bumps that will ultimately form a bump plane, many embodiments may involve the application of a seed layer 350. A seed layer generally refers to an electroless plating of a thin layer of metal by which the subsequent bumps may be built upon. The seed layer enables the plating of the interconnects. There may also be a barrier metal adjacent to the seed which would aid in preventing electromigration or undesirable intermetallic formations. In accordance with many embodiments the seed layer may be placed by sputtering, atomic layer deposition (ALD), physical vapor deposition (PVD) or by Chemical Vapor Deposition (CVD).

Once the seed layer is placed 340, a second PR layer may be patterned and exposed creating openings to the chip and chiplet levels according to various embodiments. With the chip and chiplet surfaces exposed according to the desired pattern, the bumps or posts may then be plated 350 according to many embodiments. Referencing now FIG. 8, according to many embodiments the posts or bumps 820 are plated up through the second PR layer 810 wherein and a desired finalized bump plane may be present based on the height of the lowest level of bumps. In accordance with many embodiments the bumps are plated such that those connected to the lower chip level extend at least beyond the height of the chiplets. This can be seen in FIG. 8 where the portion of bumps 810 connected to the chip 220 extend beyond the height of the chiplets 210.

Figure 8:
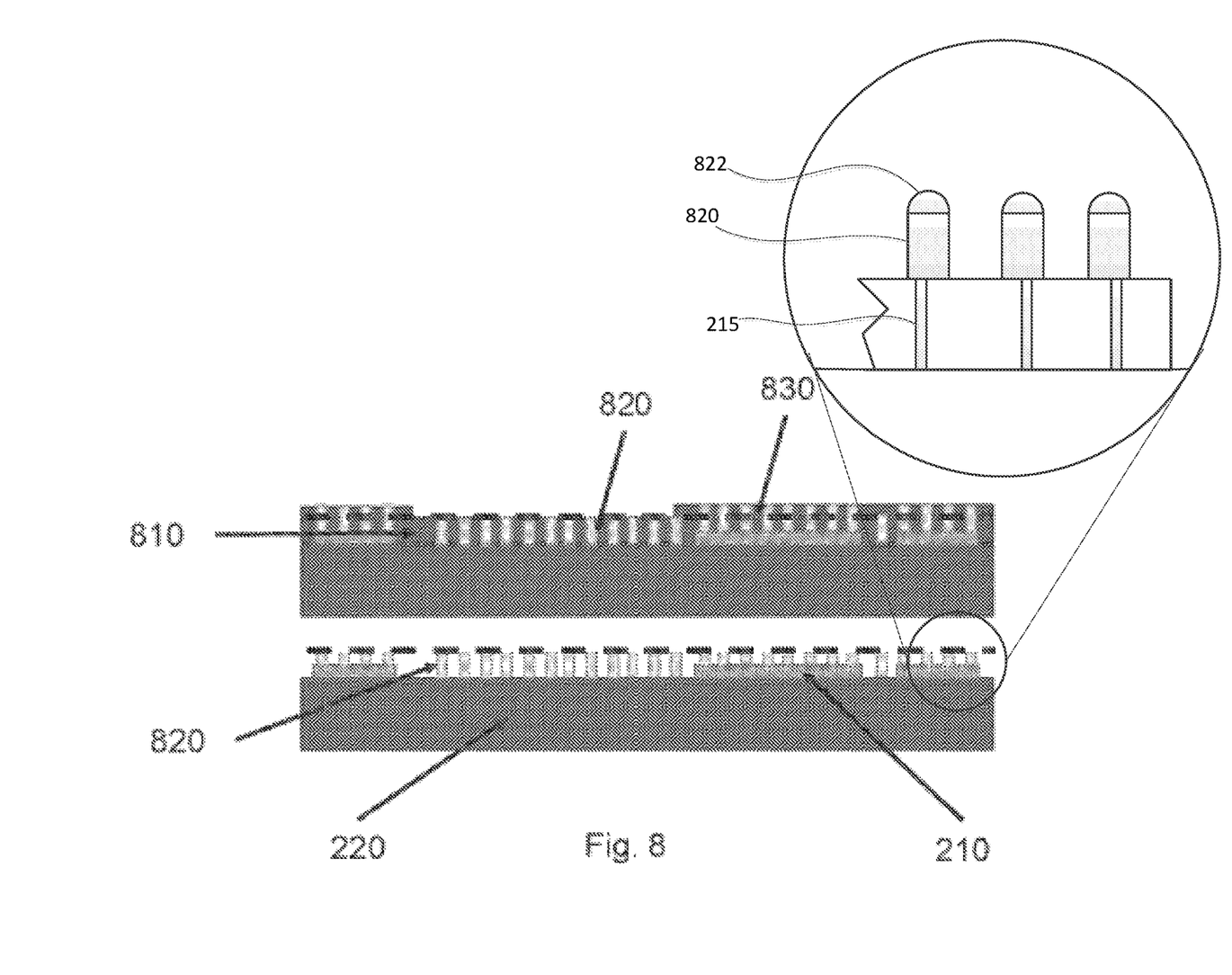
FIG. 8 illustrates an exemplary releveled bump plane in accordance with various embodiments.

According to many embodiments the finalized bump plane is releveled using a planarization or physical removal of the plated bumps and remaining PR level thus creating a level bump plane represented by element 830 in FIG. 8 and shown on the flow chart of FIG. 3 in step 355. Once the bump plane has been planarized and leveled 355, a solder cap 822 (FIG. 8) may then be plated on the bumps for the future bonding of two subsequent chips, according to various embodiments.

The final steps in releveling the bump plane according to many embodiment involves the removal of 365 the remaining PR layer as well as stripping 370 the seed layer. Thus, the releveled bump plane of a chip to chiplet IC is illustrated in FIG. 8.

Figure 4:
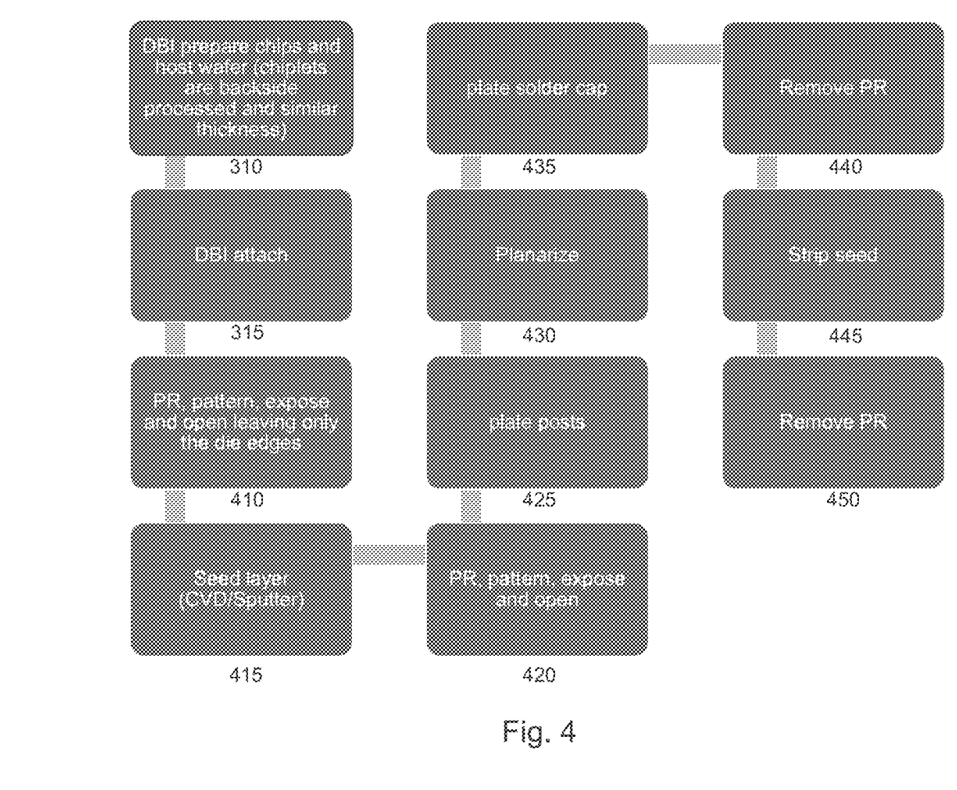
FIG. 4 illustrates another flow chart of a method for releveling bump planes in accordance with embodiments.

In accordance with various other embodiments, the releveling of the bump plane may be done via other process steps illustrated in FIG. 4. Similar to the process illustrated in FIG. 3, many embodiments, as illustrated in FIG. 4, utilize the DBI technology by preparing and bonding the chiplets to chips prior to building and leveling of a bump plane.

In accordance with many embodiments, the process flow illustrated in FIG. 4 may pattern and expose a PR layer 510 without the application of a passivation layer illustrated by step 320 of FIG. 3. In accordance with various embodiments, the PR layer is patterned and exposed such that only the edges of the chiplets are left covered with a PR material. This can be further illustrated by FIG. 6 wherein the edges of the chiplets remain covered by the PR layer 610. This is a preferable process because the subsequent application of a seed layer 415 will not create metallic contacts to the edges of the chiplets, which will aid in the building up or plating of the bumps.

Once a seed layer is placed 415 in accordance with embodiments illustrated in FIG. 4, a second PR layer is patterned and exposed to open the desired interconnect locations on the chip and chiplets. From there, similar to the embodiments previously illustrated in FIG. 3 the bumps or posts are then plated and built up to the desired level. In accordance with many embodiments, the plating of the bumps occurs at a certain rate and when it is completed the remaining surface is still uneven requiring the subsequent removal of material to have a level surface. Preferably, the removal or releveling of the surface is done through planarization or cutting off of material. In many embodiments the planarization 355, 430, 530, and 745 may be done by any number of methods that may include the use of grinding, chemical-mechanical polish (CMP) or laser ablation.

Similar to the process illustrated in FIG. 3, and according to various embodiments, step 435 involves the application of a solder cap for subsequent chip to chip bonding.

In accordance with many embodiments and illustrated in FIG. 4, steps 440 through 450 involve the removal of the previously applied PR layers and seed layer. In many embodiments, the removal of the PR and seed layers is done through chemical etching by which the relatively thin layers are removed with little effect on the plated bumps or other more permanent layers.

Figures 5, 6:
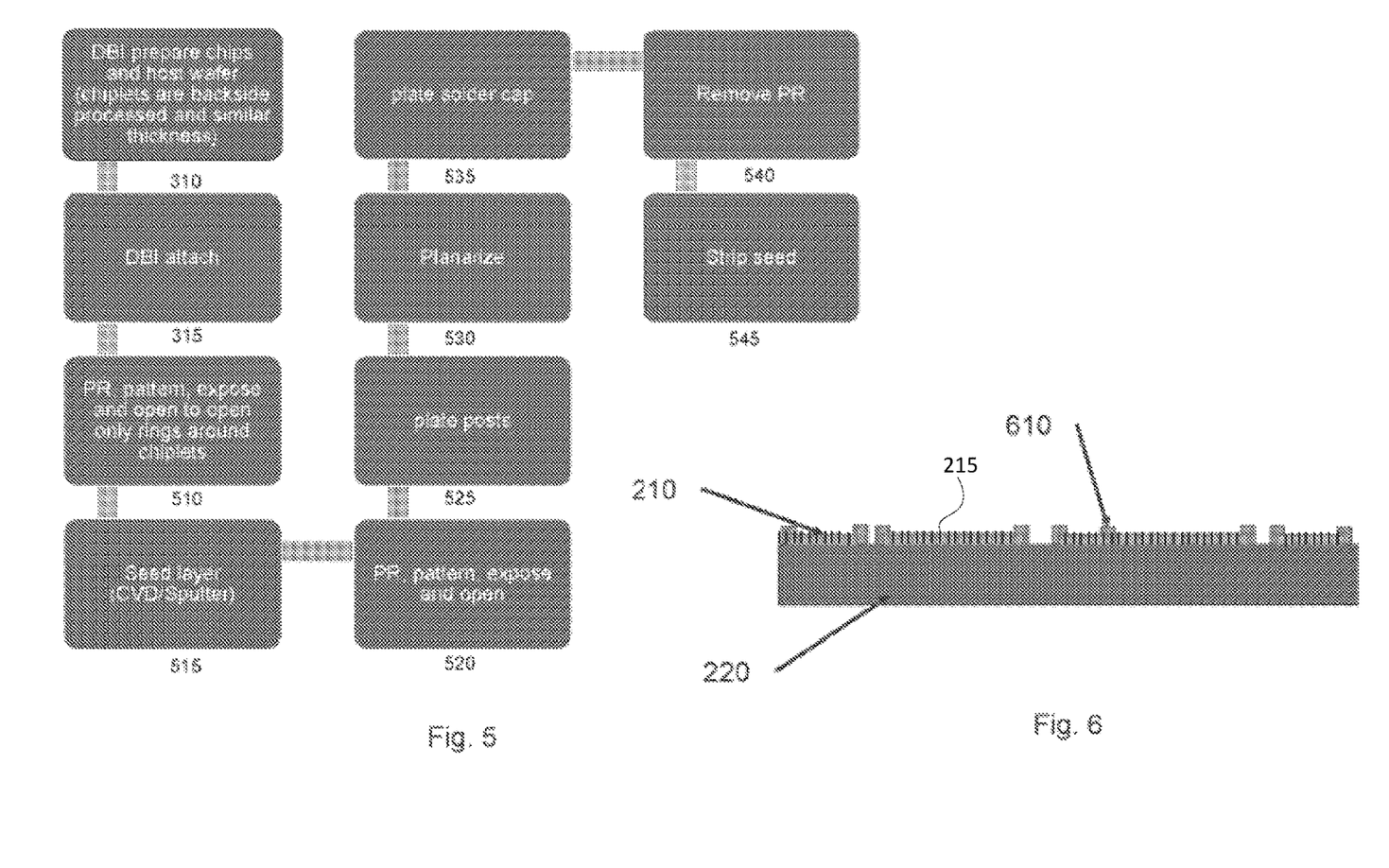
FIG. 5 illustrates yet another flow chart of a method for releveling bump planes in accordance with embodiments.
FIG. 6. illustrates an embodiment in accordance to various process flows described herein.

Turning now to FIG. 5, according to some embodiments, the process illustrated therein is similar to that of FIG. 4 with the absence of the additional PR removal steps. FIG. 5 illustrates one of various embodiments in which a single PR removal process is used 540. In some embodiments the PR removal process may include the removal of all the PR layers applied; while in other embodiments some may remain.

Figure 7:
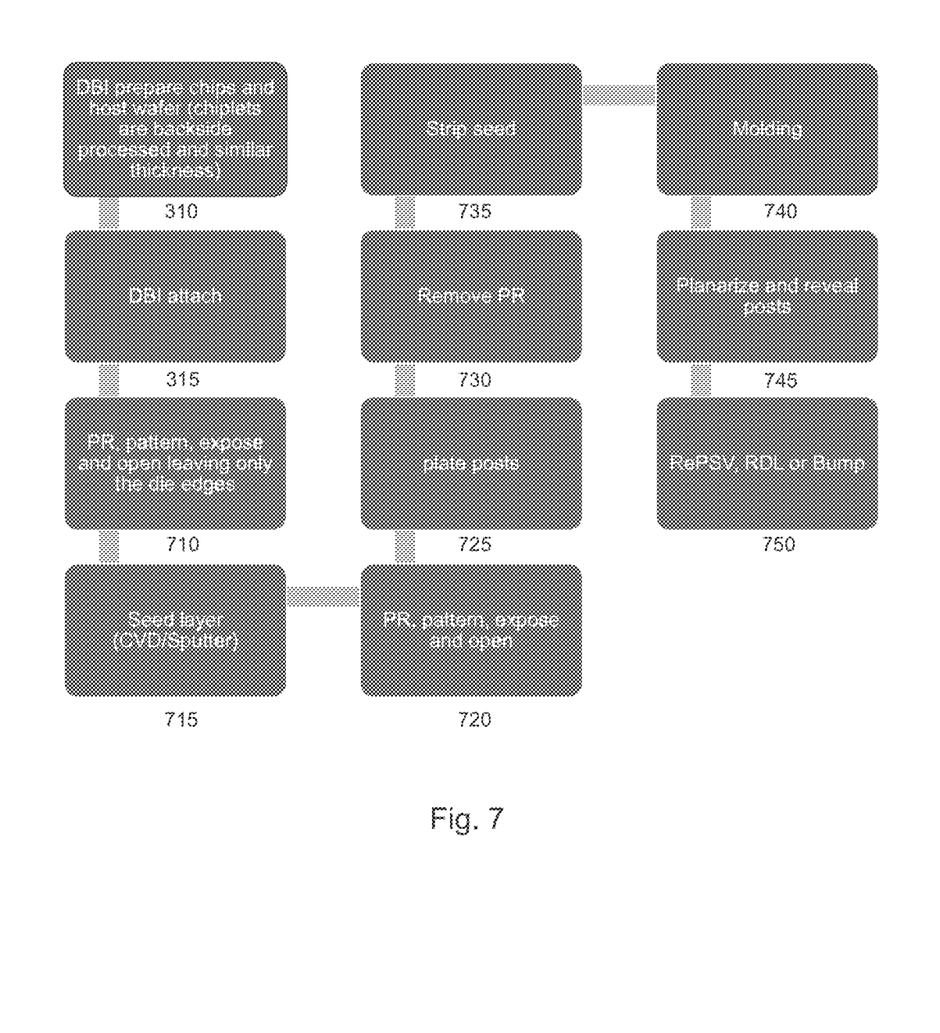
FIG. 7 illustrates another flow chart of a method for releveling bump planes in accordance with embodiments.

FIG. 7 illustrates another process flow in accordance with various embodiments. The flow illustrated is similar to that presented in FIGS. 4 and 5, however the releveling of the bump plane may follow another process after the posts or bumps have been plated. For example, before planarizing the posts the PR layers and seed layer may be removed 730 and 735. Additionally, prior to planarizing 745 to reveal the posts a type of molding 740 may be formed or applied to the chiplet side of the IC thereby covering the exposed surfaces of the larger chip and chiplets as wells as the plated posts of the chip and chiplets. In some embodiments this may be similar to the PR layer 810 illustrated in FIG. 8. In accordance with many embodiments, the molding may be a compression type molding while in other embodiments, the molding may be a vacuum format. In accordance with many embodiments, the molding may be an epoxy or silicon based material.

Once the molding has been applied or formed covering the surfaces, the layer may be planarized or back-ground. Back-grinding refers to a post process by which a layer or layers may be removed by any suitable method that will result in exposing the plated posts. The exposure of the plated posts by planarizing thus establishes a re-leveled bump plane from which the posts, and thus the IC with chiplets, may be prepared for subsequent bonding.

Once the planarization has been completed, the exposed posts/bumps may be prepared for bonding using any suitable method. In accordance with many embodiments the preparing of the posts may be done by the application of a redistribution layer (RDL). An RDL is an additional layer that allows for the interconnects to be redistributed to other locations. Additionally, other embodiments may include the use of a Re-passivation (RePSV). After RDL or RePSV the solder cap may be applied thereby creating the bumps required to will allow the re-leveled chip with chiplets to be bonded to the subsequent layers.

Figure 9:
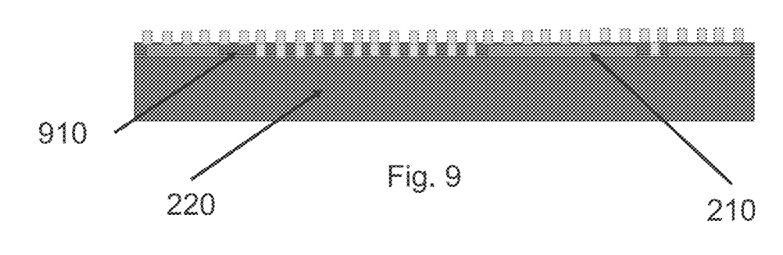
FIG. 9 illustrates an exemplary embodiment of a releveled bump plane in accordance with embodiments.

Turning now to FIG. 9, according to many embodiments the bump plane may be configured and releveled using any number of processes presented herein where a permanent layer of material 910, such as a mold layer, may be applied to the chip after a base layer of posts have been plated from the chip level. In accordance with many embodiments, the permanent layer may be a permanent resist layer or a dielectric layer. In accordance with various embodiments, the permanent layer may then be ground down or partially removed to expose the die. In other embodiments the grinding of the surface may only be done to remove as much material as necessary to create a surface just above the level of the chiplet. One exemplary method would be to leave a small surface above the chiplet to eliminate the need for additional dielectric material. The back grinding or partial removal of the permanent layer 910 may be considered equivalent to the planarization of other methods presented herein because the intent is to create one level surface from which to build the permanent interconnection bumps. In other words, it is to create the releveled bump plane.

In accordance with many embodiments a PR layer may then be patterned on top of the background permanent layer and exposed so as to create openings to the pre-plated posts and the chiplets such that a final plating may occur to create the final bump level for future bonding.

Figure 10:
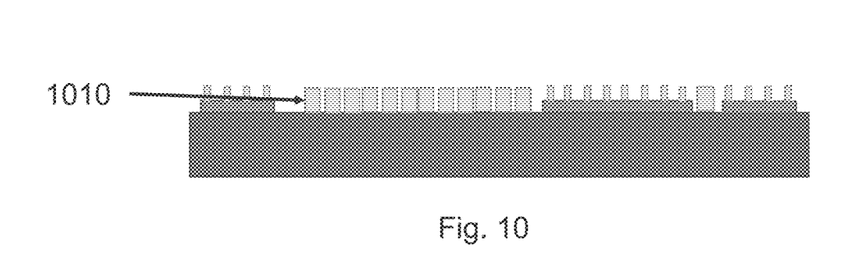
FIG. 10 illustrates another exemplary embodiment of a releveled bump plane in accordance with embodiments described herein.

According to many embodiments, FIG. 10 illustrates another method of plating of the posts that may be used in conjunction with any number of processes described herein or which may be deemed suitable. For example, FIG. 10 illustrates a process by which the entire surface of chip and chiplets is patterned and exposed to create holes to the chiplets and chip accordingly. However, in accordance with many embodiments the exposed holes to the chips are larger than those for the chiplets. The process of plating over the entire surface where some holes are larger than others will result in the larger holes producing larger bumps 1010 at the same rate as the smaller bumps corresponding to the chiplets. Thus, the timed plating process will result in a single level plane of bumps or posts by which future bonding may occur.

In accordance with many embodiments described herein, the releveled bump plane on the chip is then ready for bonding to the next level assembly, such as the another chip, interposer, substrate, etc. In accordance with many embodiments bonding may follow the process steps discussed previously or in other embodiments the chiplets may be predisposed with posts on a back side surface and the chips may also have posts pre-plated to the chip to chiplet bonding surface. This is illustrated in FIG. 11 where the pre-posted chiplets 1120 may be configured to have posts at a first height and prepared to be bonded to the chip 220. The chip 220, in accordance with various embodiments described herein, may have the bump plane and corresponding posts 1130 configured to the same level as the pre-posted chiplets 1120. In such embodiments the posts on the chiplets and those on the chip may be the same or similar height such that minimal processing is necessary to create a bond. The configuration is then ready to be bonded to the next level assembly 1110.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A stackable chip comprising:
   an individual chip having a front surface and a back surface and a plurality of side surfaces wherein the front surface comprises a plurality of interconnects;
   a plurality of chiplets bonded to the front surface of the individual chip, each of the plurality of chiplets having a front chiplet surface and a back chiplet surface and a plurality of side chiplet surfaces, and each of the plurality of chiplets having a plurality of through silicon vias for interconnections between the individual chip and the front chiplet surface of the chiplet;
   a plurality of plated posts disposed on the front surface of the individual chip and the front surface of the plurality of chiplets, the plurality of plated posts terminating in a single level across an upper portion of the stackable chip, wherein the posts are configured to connect to the plurality of through silicon vias of the chiplets and the interconnects of the individual chip; and
   a solder cap disposed on the plurality of plated posts.

2. The stackable chip of claim 1 wherein the chiplets are configured in a manner comprising elements selected from a group consisting of SerDes, Memory, and parallel interface chips.

3. The stackable chip of claim 1 further comprising a permanent layer disposed over the top surface of the chip and the top surface of the plurality of bonded chiplets.

4. The stackable chip of claim 1 further comprising a mold layer disposed over the top surface of the chip and the top surface of the plurality of bonded chiplets.

5. The stackable chip of claim 4 wherein the mold layer is selected from a group consisting of epoxy and silicone.

* * * * *